(12) United States Patent  
Giroud

(10) Patent No.: US 9,175,941 B2  
(45) Date of Patent: Nov. 3, 2015

(54) INDUCTIVE PROXIMITY SENSOR AND METHOD FOR FITTING SAID SENSOR

(75) Inventor: Pierre Giroud, Guilherand Granges (FR)

(73) Assignee: CROUZET AUTOMATISMES, Valence (FR)

( * ) Notice: Subject to any disclaimer, the term of this patent is extended or adjusted under 35 U.S.C. 154(b) by 117 days.

(21) Appl. No.: 14/004,998

(22) PCT Filed: Feb. 28, 2012

(86) PCT No.: PCT/FR2012/000070  
§ 371 (c)(1),  
(2), (4) Date: Sep. 13, 2013

(87) PCT Pub. No.: WO2012/123647  
PCT Pub. Date: Sep. 20, 2012

(65) Prior Publication Data  
US 2014/0002061 A1  Jan. 2, 2014

(30) Foreign Application Priority Data

Mar. 15, 2011  (FR) ..................... 11 00777

(51) Int. Cl.  
*G01B 7/14* (2006.01)  
*G01B 7/02* (2006.01)  
*H03K 17/95* (2006.01)  
(Continued)

(52) U.S. Cl.  
CPC *G01B 7/14* (2013.01); *G01B 7/023* (2013.01); *G01D 5/2013* (2013.01); *G01D 11/245* (2013.01); *G01D 18/00* (2013.01); *H03K 17/9505* (2013.01); *Y10T 29/4902* (2015.01)

(58) Field of Classification Search  
CPC ..................... G01R 33/0023; H01F 27/402  
See application file for complete search history.

(56) References Cited

U.S. PATENT DOCUMENTS 3,898,601 A * 8/1975 Meindl .......................... 336/136  
4,006,406 A * 2/1977 Rodicker ...................... 324/239  
(Continued)

FOREIGN PATENT DOCUMENTS

EP  1 264 404  8/2003  
FR  2 445 598  7/1980  
GB  1 054 341  1/1967

OTHER PUBLICATIONS

International Search Report Issued Jun. 12, 2012 in PCT/FR12/000070 Filed Feb. 28, 2012.

*Primary Examiner* — Jermele M Hollington  
*Assistant Examiner* — Suresh K Rajaputra  
(74) *Attorney, Agent, or Firm* — Oblon, McClelland, Maier & Neustadt, L.L.P.

(57) ABSTRACT

An inductive sensor including a casing in which are positioned: a ferromagnetic core having a U shape, which core includes two external branches and a transverse branch linking the two branches; two detection coils disposed respectively on the external branches of the core; a calibration mechanism positioned between the two external branches of the magnetic core, a longitudinal positioning of the calibration mechanism with respect to an end of the external branches being adjustable; an intermediate fixing piece for fastening the calibration mechanism onto the ferromagnetic core, the intermediate fixing piece being placed forcibly in an opening made in the transverse branch, the calibration mechanism including a threaded zone configured to be screwed into a smooth hole made in the intermediate fixing piece.

16 Claims, 3 Drawing Sheets

(51) Int. Cl.
*G01D 5/20* (2006.01)
*G01D 11/24* (2006.01)
*G01D 18/00* (2006.01)

(56) References Cited

U.S. PATENT DOCUMENTS

| | | | |
|---|---|---|---|
| 4,387,339 A * | 6/1983 | Akerblom | 324/207.18 |
| 4,635,016 A * | 1/1987 | Guery et al. | 335/230 |
| 4,709,205 A * | 11/1987 | Baurand et al. | 324/127 |
| 4,771,238 A * | 9/1988 | Caruso et al. | 324/229 |
| 4,967,153 A * | 10/1990 | Langley | 324/174 |
| 5,003,258 A * | 3/1991 | Mancini | 324/207.12 |
| 5,336,997 A * | 8/1994 | Anim-Appiah et al. | 324/207.16 |
| 5,814,986 A * | 9/1998 | Goskowicz et al. | 324/207.26 |
| 6,335,617 B1 * | 1/2002 | Osadchy et al. | 324/202 |
| 6,424,145 B1 | 7/2002 | Woolsey et al. | |
| 8,237,323 B2 * | 8/2012 | Badey et al. | 310/263 |
| 8,896,306 B2 * | 11/2014 | Hamberger et al. | 324/253 |
| 2001/0019262 A1 * | 9/2001 | Woolsey et al. | 324/207.26 |
| 2001/0052771 A1 * | 12/2001 | Jagiella | 324/207.16 |
| 2004/0251897 A1 * | 12/2004 | Pedersen | 324/253 |
| 2006/0103372 A1 * | 5/2006 | LaClair | 324/207.15 |
| 2008/0094165 A1 * | 4/2008 | Orlando et al. | 336/221 |
| 2011/0133975 A1 * | 6/2011 | Cartier Millon et al. | 341/176 |

\* cited by examiner

INDUCTIVE PROXIMITY SENSOR AND METHOD FOR FITTING SAID SENSOR

TECHNICAL FIELD OF THE INVENTION

The invention relates to an inductive sensor comprising a casing in which a U-shaped ferromagnetic core is positioned. The core comprises two outer branches extending in a longitudinal direction and a transverse branch connecting said two branches. Two detection coils are provided, arranged one on each of the outer branches of the core, and are intended to be connected to processing means. Calibration means are positioned between the two outer branches of the magnetic core, a longitudinal positioning of said calibration means relative to the end of the outer branches being adjustable.

The invention also relates to a method of mounting said sensor according to the invention.

PRIOR ART

The use of an inductive sensor for the detection of a non-permeable or magnetic ferromagnetic target is known.

As described in document EP1264404, the proximity sensor comprises a U-shaped electromagnetic core. The detector also comprises two coils, arranged one on each of the branches of the U-shaped core.

The coils are able to produce a variable electromagnetic field. The presence of a metal object in an environment close to the end of the branches of the U modifies the reluctance of the electromagnetic system. The variation of the reluctance is measured by means of the variation of the inductance and/or the resistance of the coils.

By way of example, in the presence of a conductive object made of copper or aluminum, the inductance of the coil decreases when the object is located in the magnetic field produced by the coils. Again by way of example, the magnetic core of the sensor tends to become saturated in the presence of a magnetic object, such as a magnet, and the impedance of the coil varies.

The device according to document EP12644404 comprises calibration means that are positioned preferably between the two branches of the U-shaped magnetic core. By way of exemplary embodiment, the calibration means comprise a calibration bolt. The position of the calibration bolt relative to the end of the branches of the U of the core is adjustable in order to change the level of inductance measured by the detection coils positioned around the core. In accordance with this known embodiment, the bolt comprises a threaded zone for facilitating the movement of the bolt and the calibration of the assembly. The addition of a part for this adjustment process then complicates the assembly of the proximity detector.

SUMMARY OF THE INVENTION

The object of the invention is therefore to overcome the disadvantages of the prior art by proposing a proximity detector comprising calibration means.

The inductive sensor according to the invention comprises an intermediate fixing part for fixing the calibration means on the ferromagnetic core, the intermediate fixing part being placed forcibly in an opening formed in the transverse branch of the ferromagnetic core. The calibration means comprise a threaded zone able to screw into a smooth hole formed in the intermediate fixing part so as to be displaced between the outer branches.

In accordance with a development of the invention, the opening in the transverse branch of the ferromagnetic core is a through-opening. A smooth hole passes through the intermediate fixing part such that a first end of the calibration means is located between the outer branches of the ferromagnetic core and a second end is positioned outside said outer branches.

The intermediate fixing part preferably comprises a first cylindrical zone passing through the ferromagnetic core so as to be positioned inside the outer branches, and a second cylindrical zone positioned outside, the first and the second cylindrical zone being connected by a shoulder zone bearing against the transverse branch of the ferromagnetic core.

The inductive sensor preferably comprises hard resin between an inner wall of the second cylindrical zone and the outer wall of the calibration means.

In accordance with a specific embodiment, the first cylindrical zone of the intermediate fixing part comprises a soft end, which is deformable and truncated such that a jamming of said part after the driving of the calibration means into the smooth hole is ensured.

The intermediate fixing part is advantageously made of an insulating material.

The intermediate fixing part advantageously comprises more than 50% polyformaldehyde.

The method according to the invention consists in forcibly positioning the intermediate fixing part in the hole formed in the transverse branch of the ferromagnetic core, then screwing the calibration means, in a self-tapping manner, into the hole formed in the intermediate fixing part. Lastly, the method consists in pouring the hardening resin into the cavity in the intermediate fixing part so as to block any screwing movement of the calibration means relative to the intermediate fixing part.

BRIEF DESCRIPTION OF THE FIGURES

Further advantages and features will become clearer from the following description of specific embodiments of the invention, given by way of non-limiting example and illustrated in the accompanying drawings, in which.

DETAILED DESCRIPTION OF AN EMBODIMENT

Figure 1:
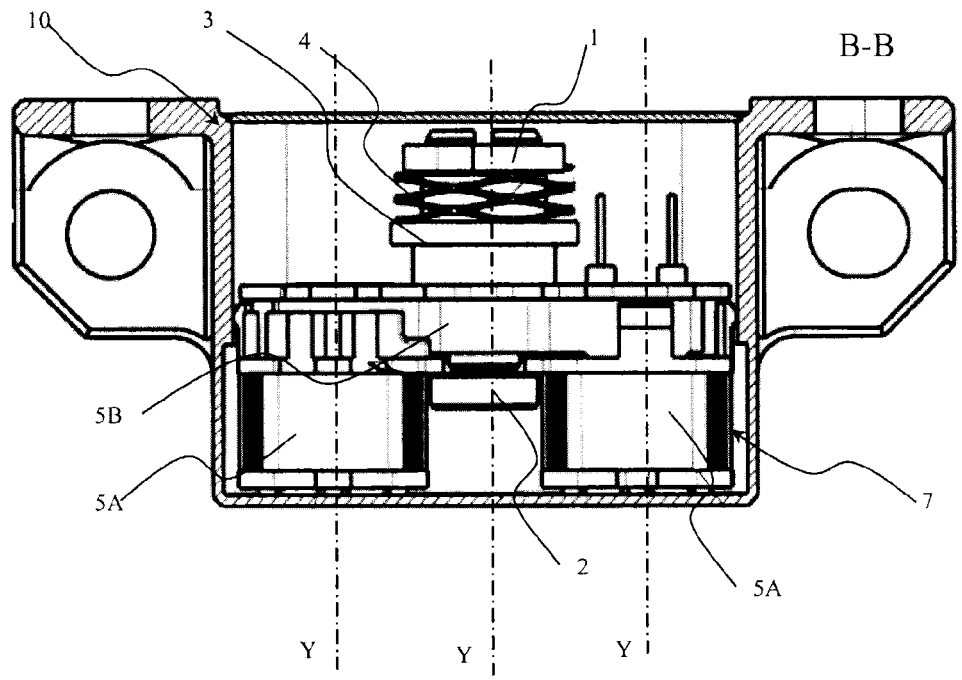
FIGS. 1 and 2 show sectional views of an inductive proximity sensor in accordance with a first preferred embodiment of the invention.
Figure 2:
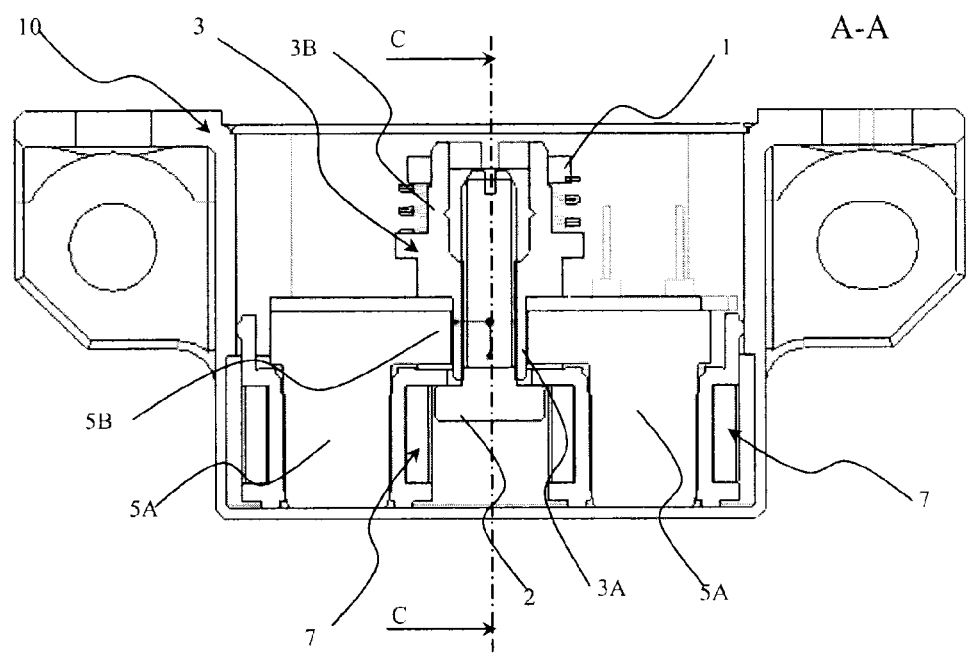
Figure 3:
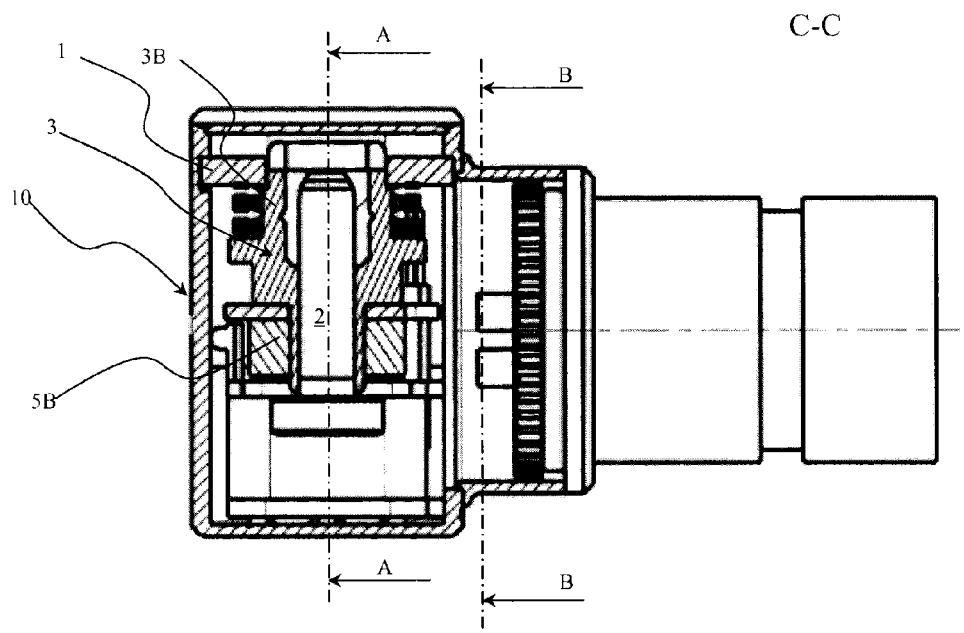
FIG. 3 shows a sectional side view of an inductive proximity sensor according to FIG. 2.
Figure 4:
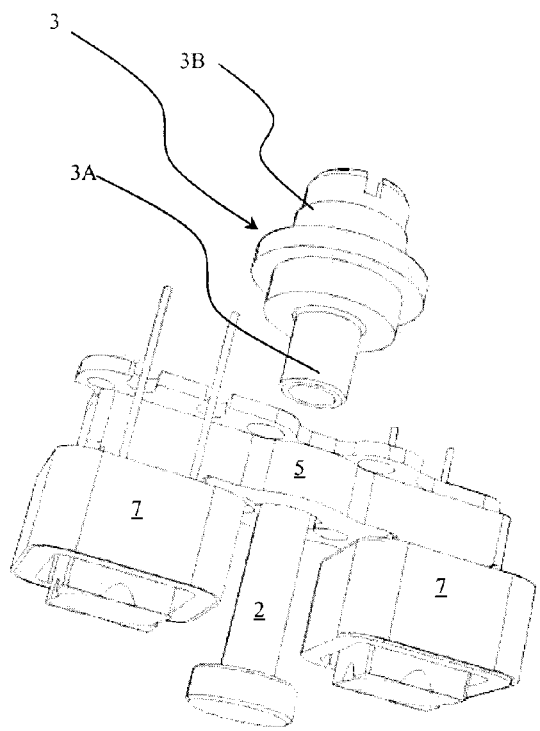
FIG. 4 shows a perspective view of an inductive proximity sensor during the assembly process.
Figure 5:
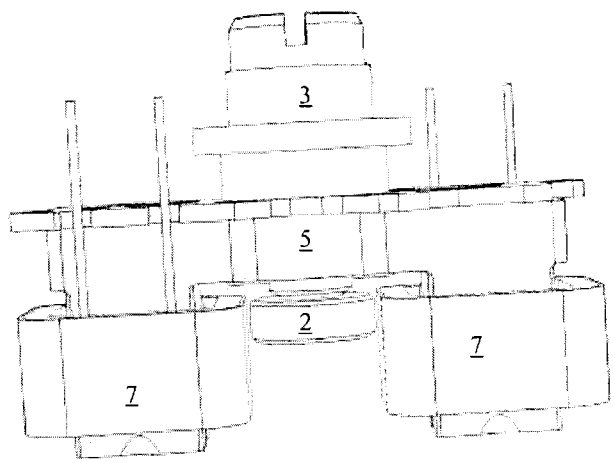
FIGS. 5 and 6 show perspective views of an inductive proximity sensor in different calibration positions.
Figure 6:
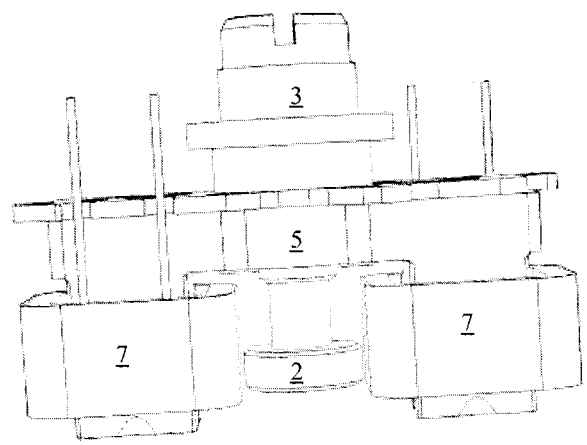
Figure 7:
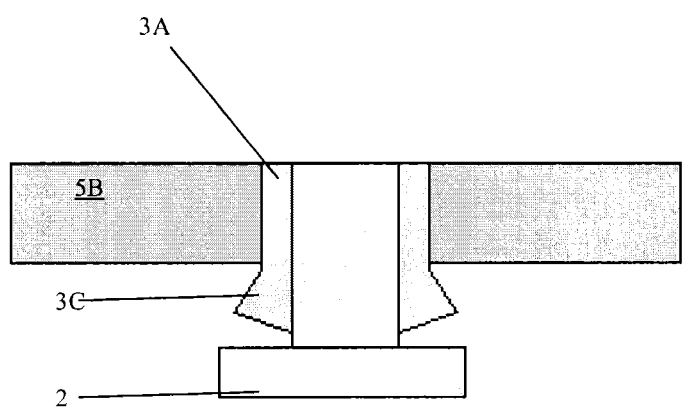
FIG. 7 shows a detailed view of calibration means of an inductive sensor according to FIG. 1.

In accordance with a preferred embodiment of the invention as shown in FIG. 1, the inductive sensor for detecting a target comprises a U-shaped ferromagnetic core 5. The core then comprises two outer branches 5A extending along a longitudinal axis Y and a transverse branch 5B connecting said two branches. The transverse branch is substantially perpendicular to the longitudinal axis Y.

Two detection coils 7 are provided, arranged one on each of the outer branches 5A of the core 5. The coils are to be connected to processing means (not shown).

The inductive sensor comprises calibration means 2 positioned between the two outer branches 5A of the magnetic core 5. The calibration means are made of a ferromagnetic material. A longitudinal positioning of said calibration means relative to the end of the branches of the U allows a calibration of the inductive sensor. The positioning of the calibration means relative to the core is then adjustable. By way of example, the calibration means 2 are displaced in a parallel manner between the outer branches 5A.

All the above-described elements forming the sensor are positioned inside a casing 10.

In accordance with a preferred embodiment of the invention, the inductive sensor comprises an intermediate fixing part 3 for fixing the calibration means 2 on the ferromagnetic core 5.

Said intermediate fixing part 3 is placed forcibly in an opening formed in the transverse branch 5B of the ferromagnetic core 5. In other words, the intermediate fixing part 3 is forcibly driven into the magnetic core 5. The intermediate fixing part is hollow and preferably comprises a smooth hole of which the longitudinal axis is parallel with that of the outer branches 5A of the core.

The calibration means are elongate in shape, preferably cylindrical. The calibration means comprise a threaded zone at one end of the elongate shape. This threaded zone is able to screw forcibly into the smooth hole formed in the intermediate fixing part.

The intermediate fixing part 3 is made of an insulating polymer material offering a certain flexibility and low friction. By way of example, the intermediate fixing part comprises more than 50% polyformaldehyde. The choice of the material allows a self-tapping of the intermediate fixing part 3 via the threaded zone of the calibration means 2. Depending on the depth to which the threaded zone is driven into the smooth hole self-tapped as the threaded zone passes through, the calibration means can be displaced and positioned between the outer branches 5A.

In accordance with an embodiment of the invention, the opening in the transverse branch 5B of the ferromagnetic core 5 is a through-opening. A smooth hole then passes through the intermediate fixing part 3 such that a first end of the calibration means 2 is located between the outer branches 5A of the ferromagnetic core 5 and a second end is positioned outside said outer branches 5A. By way of example, the intermediate fixing part 3 comprises a first cylindrical zone 3A passing through the ferromagnetic core 5 so as to be positioned inside the outer branches 5A, and a second cylindrical zone 3B positioned outside. The first and second cylindrical zone are connected via a shoulder zone bearing against the transverse branch 5B of the ferromagnetic core 5.

The screwing of the calibration means 2 into the intermediate fixing part 3 is therefore braked naturally. In addition, any damaging play between the two parts 2 and 3 is cancelled so as to ensure satisfactory reliability of the adjustment process.

In accordance with a particular embodiment of the invention, the assembly of the part comprising the calibration means 2, the intermediate fixing part 3, the magnetic core 5, and the coils 7 is held forcibly in the casing by a spring 4 and a catch 1. The spring 4 ensures a constant hold whilst eliminating differential thermal stresses which could develop and damage the precision of the sensor.

In accordance with a specific embodiment, the first cylindrical zone of the intermediate fixing part 3 comprises a soft end, which is deformable and truncated 3C such that a jamming of said part after the driving of the calibration means into the smooth hole is ensured. In fact, the conical shape comes to rest on the edge on the yoke and prevents any movement of the assembly formed by the adjustment means 2 and the intermediate fixing part 3. This locking is completed by the insertion, by forcible screwing, of the calibration means 2 into the intermediate fixing part 3.

The second cylindrical zone 3B of the intermediate fixing part is hollow and enables access to an end of the adjustment means. Once the adjustment of the calibration means 2 is complete, the volume available inside the second cylindrical zone 3B is filled with a hard resin. The presence of this resin makes it possible to ensure that the calibration means 2 are positioned reliably relative to the intermediate fixing part 3, and in particular are fixed against rotation.

The invention also relates to a method of mounting and calibrating an inductive sensor as defined above. The method consists of:
  forcibly positioning the intermediate fixing part 3 into the hole formed in the transverse branch 5B of the ferromagnetic core 5. The forced positioning consists of a driving in translation in a direction substantially parallel to the longitudinal axis of the outer branches 5A of the magnetic yoke 5.
  screwing, in a self-tapping manner, the calibration means 2 inside the hole formed in the intermediate fixing part 3.

The method of mounting and calibrating the sensor consists of pouring the hardening resin into the cavity present in the second cylindrical zone 3B of the intermediate fixing part 3 so as to block any screwing movement of the calibration means 2 relative to the intermediate fixing part 3.

The invention claimed is:

1. An inductive sensor comprising:
  a casing including:
    a U-shaped ferromagnetic core including two outer branches extending in a longitudinal direction and a transverse branch connecting the two branches;
    two detection coils, arranged one on each of the outer branches of the core and configured to be connected to processing means;
    calibration means positioned between the two outer branches of the magnetic core, a longitudinal positioning of the calibration means relative to the end of the outer branches being adjustable; and
    an intermediate fixing part for fixing the calibration means on the ferromagnetic core,
  wherein the calibration means includes a threaded zone configured to screw into a smooth hole formed in the intermediate fixing part so as to be displaced between the outer branches, and
  wherein the intermediate fixing part is placed forcibly in an opening formed in the transverse branch and includes:
    a first cylindrical zone passing through the ferromagnetic core and including a soft end, which is deformable and truncated to be positioned inside the outer branches and to ensure a jamming of the part after the driving of the calibration means into the smooth hole, and
    a second cylindrical zone positioned outside the outer branches.

2. The inductive sensor as claimed in claim 1, wherein the first and the second cylindrical zones are connected by a shoulder zone bearing against the transverse branch of the ferromagnetic core.

3. The inductive sensor as claimed in claim 1, wherein the opening in the transverse branch of the ferromagnetic core is a through-opening, and a smooth hole passes through the intermediate fixing part such that a first end of the calibration means is located between the outer branches of the ferromagnetic core and a second end is positioned outside the outer branches.

4. The inductive sensor as claimed in claim 3, further comprising a hard resin between an inner wall of the second cylindrical zone and an outer wall of the calibration means.

5. The inductive sensor as claimed in claim 1, wherein the intermediate fixing part is made of an insulating material.

6. The inductive sensor as claimed in claim 5, wherein the intermediate fixing part comprises more than 50% polyformaldehyde.

7. A method of mounting an inductive sensor as claimed in claim 1, comprising:
   forcibly positioning the intermediate fixing part into the hole formed in the transverse branch of the ferromagnetic core;
   screwing, in a self-tapping manner, the calibration means inside the hole formed in the intermediate fixing part.

8. The method of mounting an inductive sensor as claimed in claim 7, further comprising pouring a resin into a cavity in the intermediate fixing part so as to block any screwing movement of the calibration means relative to the intermediate fixing part.

9. An inductive sensor comprising:
   a casing including:
      a U-shaped ferromagnetic core including two outer branches extending in a longitudinal direction and a transverse branch connecting the two branches;
      two detection coils arranged on each of the outer branches of the core and configured to be connected to processing means;
      a calibration screw positioned between the two outer branches of the magnetic core, a longitudinal positioning of the calibration screw relative to the end of the outer branches being adjustable; and
      an intermediate fixing part for fixing the calibration screw on the ferromagnetic core,
   wherein the calibration screw includes a threaded zone configured to screw into a smooth hole formed in the intermediate fixing part so as to be located between the outer branches, and
   wherein the intermediate fixing part is placed forcibly in an opening formed in the transverse branch and includes:
      a first cylindrical zone passing through the ferromagnetic core and including an end positioned inside the outer branches, and
      a second cylindrical zone positioned outside the outer branches.

10. The inductive sensor as claimed in claim 9, wherein the first and the second cylindrical zones are connected by a shoulder zone bearing against the transverse branch of the ferromagnetic core.

11. The inductive sensor as claimed in claim 10, wherein the opening in the transverse branch of the ferromagnetic core is a through-opening, and a first end of the calibration screw is located between the outer branches of the ferromagnetic core and a second end is positioned outside the outer branches.

12. The inductive sensor as claimed in claim 10, further comprising a hard resin between an inner wall of the second cylindrical zone and an outer wall of the calibration screw.

13. The inductive sensor as claimed in claim 9, wherein the intermediate fixing part is made of an insulating material.

14. The inductive sensor as claimed in claim 13, wherein the intermediate fixing part comprises more than 50% polyformaldehyde.

15. A method of mounting an inductive sensor as claimed in claim 9, comprising:
   forcibly positioning the intermediate fixing part into the hole formed in the transverse branch of the ferromagnetic core;
   screwing, in a self-tapping manner, the calibration screw inside the hole formed in the intermediate fixing part.

16. The method of mounting an inductive sensor as claimed in claim 15, further comprising pouring a resin into a cavity in the intermediate fixing part so as to block any screwing movement of the calibration screw relative to the intermediate fixing part.

\* \* \* \* \*